(12) United States Patent  
Tien

(10) Patent No.: US 8,575,494 B2
(45) Date of Patent: Nov. 5, 2013

(54) PRINTED CIRCUIT BOARD WITH MULTI-LAYER CERAMIC CAPACITOR ARRAY

(75) Inventor: Chun-Yuan Tien, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 174 days.

(21) Appl. No.: 13/166,772

(22) Filed: Jun. 22, 2011

(65) Prior Publication Data

US 2012/0273265 A1 Nov. 1, 2012

(30) Foreign Application Priority Data

Apr. 26, 2011 (TW) .............................. 100114532 A

(51) Int. Cl.
*H05K 1/16* (2006.01)
(52) U.S. Cl.
USPC ........................................................ 174/260
(58) Field of Classification Search
CPC ...................................................... H05K 1/16
USPC ....................................................... 174/260
See application file for complete search history.

(56) References Cited

U.S. PATENT DOCUMENTS

| 7,123,465 | B2 * | 10/2006 | Crane et al. | 361/306.2 |
| 8,138,042 | B2 * | 3/2012 | Doyle et al. | 438/253 |
| 2004/0150941 | A1 * | 8/2004 | Kuroda et al. | 361/306.3 |
| 2005/0224912 | A1 * | 10/2005 | Rogers et al. | 257/532 |
| 2006/0225916 | A1 * | 10/2006 | Nelson et al. | 174/255 |
| 2010/0033938 | A1 * | 2/2010 | Kitagawa et al. | 361/748 |
| 2010/0238605 | A1 * | 9/2010 | Lee et al. | 361/306.3 |
| 2010/0290173 | A1 * | 11/2010 | Yoon et al. | 361/321.2 |

OTHER PUBLICATIONS

Author: Appaloosa; Title: CPU Socket 775 T.jpg; Date: Sep. 14, 2009; Webpage address: http://commons/wikipedia.org/wiki/File:CPU_Socket_775_T.jpg.*

* cited by examiner

*Primary Examiner* — Timothy Thompson
*Assistant Examiner* — Charles Pizzuto
(74) *Attorney, Agent, or Firm* — Altis & Wispro Law Group, Inc.

(57) ABSTRACT

A printed circuit board (PCB) includes a bank or matrix of multi-layer ceramic capacitors (MLCCs). Each MLCC includes positive and negative electrodes respectively connected to a power layer and a ground layer of the PCB through two positive and two negative vias. A portion of the positive vias and a portion of the negative vias utilized by the same column of MLCCs are arranged in two separated lines along the flowing direction of current streams in the power layer.

8 Claims, 2 Drawing Sheets

*# PRINTED CIRCUIT BOARD WITH MULTI-LAYER CERAMIC CAPACITOR ARRAY

BACKGROUND

1. Technical Field

The present disclosure relates to printed circuit boards (PCBs) and, particularly, to a PCB having a multi-layer ceramic capacitor (MLCC) array.

2. Description of Related Art

Computer motherboards typically include a PCB, a central processing unit (CPU) socket, and a MLCC array. The PCB includes a power layer and a ground layer. The power layer and the ground layer are respectively connected to a power source and ground when the computer motherboard is in operation. The CPU socket is disposed on the PCB and configured to mount and electrically connect a CPU to the PCB. The MLCC array is disposed on the PCB, within the CPU socket. Each MLCC includes a positive electrode and a negative electrode. The positive electrode and the negative electrode are respectively connected to the power layer and the ground layer through positive and negative vias, thus electrically connecting the MLCC to the PCB. The negative vias typically run through the power layer. The MLCC array is configured to charge when the CPU is working normally and to quickly discharge to provide a transient high voltage to allow for the CPU to give a transient response.

However, if the MLCC array is not optimally arranged, a portion of the negative vias located upstream of current streams flowing in the power layer will obstruct the current streams flowing to a portion of the positive vias located downstream of the current streams and the MLCC array will not be efficiently charged.

Therefore, it is desirable to provide a PCB, which can overcome the limitations described.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION

Embodiments of the present disclosure will now be described in detail with reference to the drawings.

Figure 1:
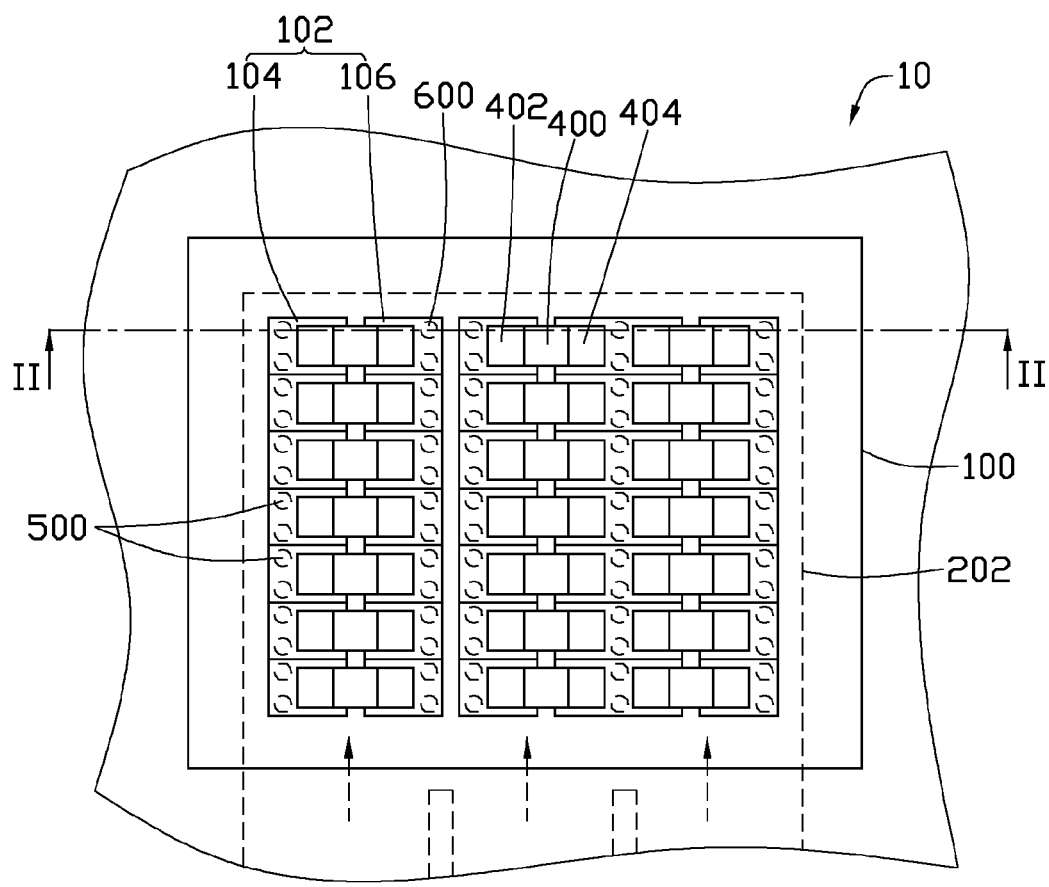
FIG. 1 is a partial, planar, and schematic view of a PCB, according to an embodiment.
Figure 2:
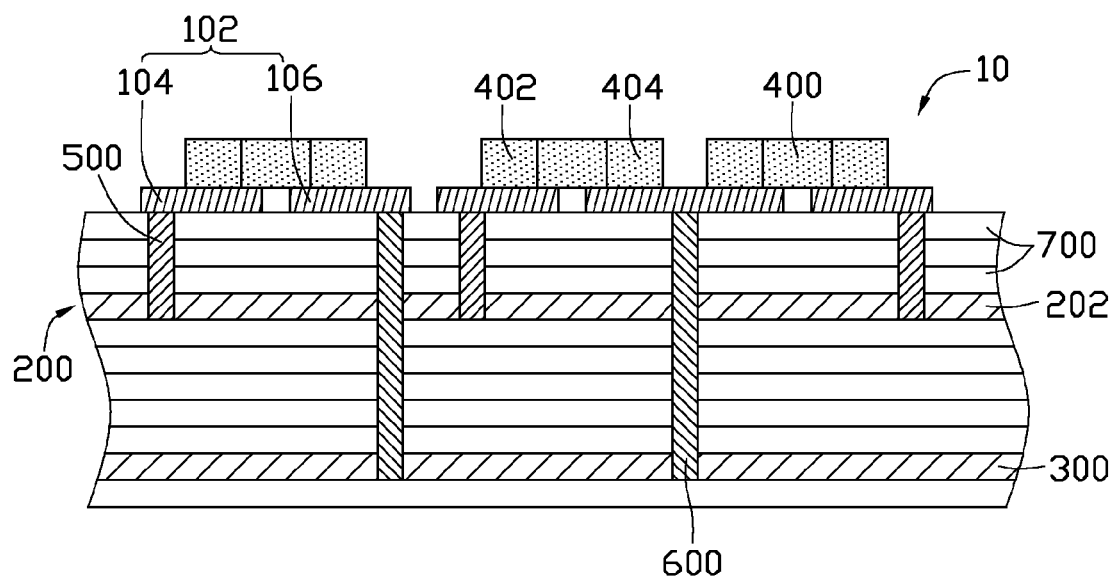
FIG. 2 is a partial, cross-sectional, and schematic view of the PCB taken along the line II-II of FIG. 1.

Referring to FIGS. 1 and 2, a PCB 10, according to an embodiment, is shown. The PCB 10, such as a section of a computer motherboard, includes an outline 100, a power layer 200, a ground layer 300, and a number of MLCCs 400.

The PCB 10 includes a mounting surface (not labeled). The outline 100 is formed on the mounting surface and marks the outer limits of a socket (not shown) to be mounted to the mounting surface. The socket is configured to mount and electrically connect a chip (not shown), such as a CPU, to the PCB 10.

The power layer 200 is an electrically conductive layer, such as a layer of copper, beneath the mounting surface and is typically connected to a power source (not shown) when the PCB 10 is functioning. The power layer 200 includes a region 202 within the outline 100. The region 202 is configured to allow current streams (shown as dotted-arrows in FIG. 1) to flow from the power source to the socket.

The ground layer 300 is also electrically conductive, beneath the power layer 200 and is typically grounded when the PCB 10 is functioning.

The MLCCs 400 are configured to charge when the chip is working normally and to quickly discharge to provide a transient high voltage to allow the chip to give a transient response.

In detail, the MLCCs 400 are arranged in a bank or matrix within the outline 100, wherein the columns of the MLCCs 400 are arranged substantially parallel to the direction of flow of the current streams. Each MLCC 400 includes a positive electrode 402 and a negative electrode 404. Each positive electrode 402 is electrically connected to the power layer 200 through two positive vias 500. Each negative electrode 404 is electrically connected to the ground layer 300 through two negative vias 600.

The negative vias 600 run through the power layer 200. A portion of the positive vias 500 and a portion of the negative vias 600 for each column of the MLCCs 400 are arranged in two separated lines along the direction of flow of the current streams. That is, for each column of MLCCs 400, the relevant negative vias 500 are in one line while the relevant negative vias 600 are in another separated line. Thus, the current streams can flow without hindrance or obstruction to all the positive vias 500 because the obstacle (i.e., the negative via 600) located upstream of the current streams flowing to a positive via 500 has been removed and thus the MLCCs 400 can be efficiently charged.

In other embodiments, each positive electrode 402 can connect to the power layer 200 through only one or more than two positive vias 500. Each negative electrode 404 can connect to the ground layer 300 through only one or more than two negative vias 500.

The PCB 10 further includes a number of pad pairs 102 formed on the mounting surface, within the outline 100. Each pad pair 102 is configured to accept an MLCC 400 by solder connection and includes a positive pad 104 and a negative pad 106. Each positive pad 104 is configured to accept a positive electrode 402 by solder connection and connect to the power layer 200 through two positive vias 500. Each negative pad 106 is configured to accept a negative electrode 404 by solder connection and connect to the ground layer 300 through two negative vias 600.

A portion of the positive pads 104 available for each column of the MLCCs 400 are physically and electrically connected with each other, as are a portion of the negative pads 106. This arrangement maintains and assists the flow of current streams to the positive vias 500 located downstream.

A portion of the negative pads 106 serving two adjacent columns of the MLCCs 400 can be physically and electrically connected with each other and can connect to the ground layer 300 through a single column of the negative vias 600. This arrangement can further reduce the number of the obstacles present in the region 202.

The PCB 10 also includes a number of isolative layers 700, a number of signal layers, and additional power layers (not labeled) interposed between the mounting surface, the power layer 200, and the ground layer 300.

It will be understood that the above particular embodiments are shown and described by way of illustration only. The principles and the features of the present disclosure may be employed in various and numerous embodiment thereof without departing from the scope of the disclosure as claimed. The above-described embodiments illustrate the scope of the disclosure but do not restrict the scope of the disclosure.

What is claimed is:

1. A printed circuit board (PCB), comprising:
a mounting surface defining an outline;
a ground layer;
a power layer positioned between the mounting surface and the ground layer, the power layer comprising a region, the region being configured to allow current streams to flow into the outline;
a plurality of multi-layer ceramic capacitors (MLCCs) mounted to the mounting surface within the outline and arranged in a matrix, wherein the columns of the MLCCs are substantially parallel to the flowing direction of the current streams, each MLCC comprises a positive electrode and a negative electrode;
a plurality of groups of positive vias, each group of positive vias running from the mounting surface to the power layer to connect a corresponding positive electrode to the power layer; and
a plurality of groups of negative vias, each group of negative vias running from the mounting surface, through the power layer, to the ground layer to connect a corresponding negative electrode to the ground layer;
wherein a portion of the positive vias and a portion of the negative vias corresponding to the same column of MLCCs are arranged in two separated lines along the flowing direction of the current streams.

2. The PCB of claim 1, wherein the PCB is a computer motherboard.

3. The PCB of claim 2, wherein the outline is configured to mark the outer limit of a chip socket of the compute motherboard.

4. The PCB of claim 3, wherein the chip socket is a central processor unit (CPU) socket.

5. The PCB of claim 1, further comprising a plurality of pad pairs formed on the mounting surface, each pad pair being configured to solder a corresponding MLCC and comprising a positive pad corresponding to the positive electrode of the corresponding MLCC and a negative pad corresponding to the negative electrode of the corresponding MLCC.

6. The PCB of claim 5, wherein a portion of the positive pads corresponding to the same column of MLCCs are physically and electrically connected with each other.

7. The PCB of claim 5, wherein a portion of the negative pads corresponding to the same column of MLCCs are physically and electrically connected with each other.

8. The PCB of claim 5, wherein a portion of the negative pads corresponding to two adjacent columns of MLCCs are physically and electrically connected with each other.

* * * * *